United States Patent
Curioni et al.

(10) Patent No.: US 9,640,759 B1
(45) Date of Patent: May 2, 2017

(54) AMORPHOUS CARBON RESISTIVE MEMORY ELEMENT WITH LATERAL HEAT DISSIPATING STRUCTURE

(71) Applicant: International Business Machines Corporation, Armonk, NY (US)

(72) Inventors: Alessandro Curioni, Gattikon (CH); Wabe W. Koelmans, Adliswil (CH); Abu Sebastian, Adliswil (CH); Federico Zipoli, Gattikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/951,489

(22) Filed: Nov. 25, 2015

(51) Int. Cl.
  *G11C 11/00* (2006.01)
  *H01L 45/00* (2006.01)
  *G11C 13/00* (2006.01)

(52) U.S. Cl.
  CPC ........ *H01L 45/149* (2013.01); *G11C 13/0069* (2013.01); *H01L 45/1233* (2013.01); *H01L 45/1246* (2013.01); *H01L 45/1253* (2013.01); *H01L 45/1608* (2013.01); *G11C 2013/0078* (2013.01)

(58) Field of Classification Search
  CPC ............ G11C 13/0069; G11C 13/0004; G11C 13/0007
  USPC .................................................. 365/148, 163
  See application file for complete search history.

(56) References Cited

U.S. PATENT DOCUMENTS

| 7,619,247 | B2 | 11/2009 | Moore et al. |
| 7,894,253 | B2 | 2/2011 | Kreupl et al. |
| 8,754,392 | B2 | 6/2014 | Caimi et al. |

(Continued)

FOREIGN PATENT DOCUMENTS

CN 101599531 A 12/2009

OTHER PUBLICATIONS

Fei Zhuge, et al., "Nonvolatile Resistive Switching Memory Based on Amorphous Carbon," Appl. Phys. Lett. 96, 163505, 2010, pp. 1-3.

(Continued)

*Primary Examiner* — Son Dinh
(74) *Attorney, Agent, or Firm* — Daniel P. Morris, Esq.; Otterstedt, Ellenbogen & Kammer, LLP

(57) ABSTRACT

A resistive memory element is provided having a layer structure. The layer structure includes two layers forming two electrically conductive electrodes, respectively, a resistively switchable material sandwiched between the two layers forming the two electrodes, and in electrical connection therewith, and a confining material. The resistively switchable material is laterally confined within the confining material, between the two layers forming the electrodes. The confining material is sufficiently electrically insulating for an electric signal applied between the two conductive electrodes to change a resistance state of the memory element in operation. The confining material has a thermal conductivity greater than 0.5 W/(m·K), and preferably greater than or equal to 30 W/(m·K). The resistively switchable material is an amorphous compound comprising carbon, which has a maximal lateral dimension, along a direction parallel to an average plane of the two layers forming the electrodes, that is less than 60 nm.

19 Claims, 4 Drawing Sheets

(56) References Cited

U.S. PATENT DOCUMENTS

| 2008/0137400 A1* | 6/2008 | Chen ........................ G11C 8/10 |
| | | 365/163 |
| 2009/0230379 A1* | 9/2009 | Klostermann .......... H01L 43/08 |
| | | 257/5 |
| 2011/0278529 A1 | 11/2011 | Xu |

OTHER PUBLICATIONS

Di Fu, et al., "Unipolar Resistive Switching Properties of Diamond-like Carbon-Based RRAM Devices," IEEE Electron Device Letters, Jul. 2011, pp. 803-805, vol. 32, Iss. 6.

A. M. Popov, et al., "Simulating Resistance Switching in Amorphous Carbon," Moscow University Computational Mathematics and Cybernetics, Apr. 2012, pp. 53-59, vol. 36, Iss. 2.

* cited by examiner

AMORPHOUS CARBON RESISTIVE MEMORY ELEMENT WITH LATERAL HEAT DISSIPATING STRUCTURE

BACKGROUND

The invention relates in general to the field of filamentary switching resistive memory elements. In particular, it relates to a resistive memory element whose resistively switchable material is an amorphous carbon compound that is laterally confined within a confining material.

Switching resistive memory elements are known. Resistive switching refers to a physical phenomenon occurring in a material that suddenly changes its resistance under action of a strong current or electric field. The change is non-volatile and reversible. Several classes of switching materials (ranging from metal oxides to chalcogenides) have been proposed in the past. The performances of these materials are appreciated mainly in terms of power consumption, integration density potential, retention, and endurance. Typical resistive switching systems are capacitor like devices, where electrodes are ordinary metals and the dielectric a resistive switching material, e.g., a transition metal oxide.

An interesting application of resistive switching is the fabrication of non-volatile resistive random-access memories (RRAM), which are promising candidates to replace conventional flash memories as they offer better scalability, higher integration density, higher throughput, lower access time, and lower power consumption.

Amorphous carbon (aC) has been proposed as a resistive switching material for RRAM applications. Compared to oxide-based RRAM, carbon promises higher memory density and lower power consumption. The mono-atomic nature of carbon would make a carbon-based memory cell scalable, even to single bonds. Such cell dimensions would limit the reset current, thus reducing the power consumption. In addition, the high resilience of carbon would enable operation at high temperatures.

Another intrinsic advantage of aC-based RRAM is the switching mechanism. Amorphous carbon is mainly formed by $sp^2$ bonds (conductive) and $sp^3$ bonds (insulating). When a set voltage is applied across the aC layer, the electric field and the Joule heating induce a clustering of $sp^2$ bonds, bringing the cell into a low resistive state (LRS). When another voltage (reset) is applied across the cell, causing a high current to flow through the $sp^2$ filaments, these filaments break down owing to Joule heating, and the cell returns to a high resistance state (HRS), as illustrated in FIG. 8. No electrochemical reaction is involved: the resistive switching in carbon is unipolar, i.e., the memory can be set and reset by means of voltages of the same polarity. In contrast, resistive switching in oxide-based RRAM occurs owing to the reduction (set) and oxidation (reset) of oxygen vacancies. Therefore, voltages of opposite polarity are needed to set and reset the cell (bipolar switching). Unipolar resistive switching, as it occurs in carbon-based RRAM, simplifies the circuit design of the memory devices, compared to bipolar switching circuits.

Another advantage of carbon-based RRAM is that no "conditioning step" is required, whereas such a step is needed in oxide-based RRAM, which involves the application of a high voltage across the cell to induce a soft breakdown and form the channel in which the filaments will then grow. Because the conditioning voltage is typically much higher than the set voltage, this step might degrade the device endurance and therefore is not desirable.

In the known, aC-based resistive memory elements, the carbon compound is typically laterally confined within a confining material. The latter is typically designed for confining heat into the cell comprising the resistively switchable material, to allow lower power consumption, in operation.

SUMMARY

According to a first aspect, the present invention is embodied as a resistive memory element having a layer structure. The layer structure comprises: two layers forming two electrically conductive electrodes, respectively; a resistively switchable material, sandwiched between the two layers forming the two electrodes, and in electrical connection therewith; and a confining material. The resistively switchable material is laterally confined within the confining material, whereas, typically, its base surfaces (e.g., its top and bottom surfaces) are, each, facing a respective one of the layers forming the two electrodes. The confining material is sufficiently electrically insulating for an electric signal applied between the two conductive electrodes to change a resistance state of the memory element, by resistively switching the switchable material, in operation. Still, the confining material has a thermal conductivity greater than 0.5 W/(m·K), and preferably greater than or equal to 30 W/(m·K). The resistively switchable material is an amorphous compound comprising carbon, which has a maximal lateral dimension that is less than 60 nm, along a direction parallel to an average plane of the two layers forming the two electrodes.

According to a second aspect, the invention is embodied as a resistive memory device, comprising one or more memory elements, each according to embodiments of the invention.

According to a third aspect, the invention is embodied as a method of storing information in a resistive memory element such as described above.

According to a fourth aspect, the invention is embodied as a fabrication method of a resistive memory element according to embodiments of the invention.

Embodiments of the invention will be described in more detail below, by way of illustrative and non-limiting example, with reference to the accompanying drawings.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein.

Figure 1:
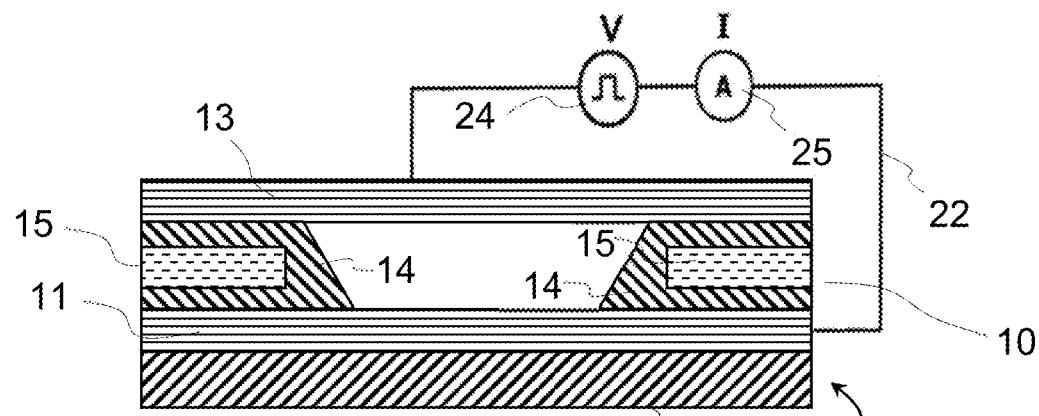
FIG. 1 is a two-dimensional (2D) cross-sectional view of a resistive memory device, according to an embodiment of the invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments. Moreover, technical features depicted in the drawings are not necessarily to scale.

DETAILED DESCRIPTION

Principles of the present invention will be described herein in the context of illustrative resistive memory element having a layer structure and methods for implementing same. It is to be appreciated, however, that the invention is not limited to the specific apparatus and/or methods illustratively shown and described herein. Rather, it will become apparent to those skilled in the art given the teachings herein that numerous modifications can be made to the embodiments shown that are within the scope of the claimed invention. That is, no limitations with respect to the embodiments shown and described herein are intended or should be inferred.

Referring generally to FIGS. 1-7, an aspect of the invention is first described, which concerns a resistive memory element 10. The terminology "memory element" is broadly used hereafter to denote a memory device capable of being operated as a memory. It may, for instance, be embodied as a random-access memory (RAM) element, but not necessarily. The device may comprise one or more memory cells. Still, one or more embodiments described below refer to a single memory cell, while one or more other embodiments may refer to a multiple-cell memory device.

The memory element 10 has a layer structure, which notably comprises two layers forming two electrically conductive electrodes 11, 13, respectively. It further comprises a resistively switchable material 12, comprising amorphous carbon, and sandwiched between the two layers forming the two electrodes 11, 13. The resistively switchable material 12 is in direct contact with the electrodes. In variants, an electrode may be formed of multiple, superimposed layers. In all cases yet, the resistively switchable material 12 is in electrical connection with each of the two layers 11 and 13 forming the base electrodes.

Figure 10:
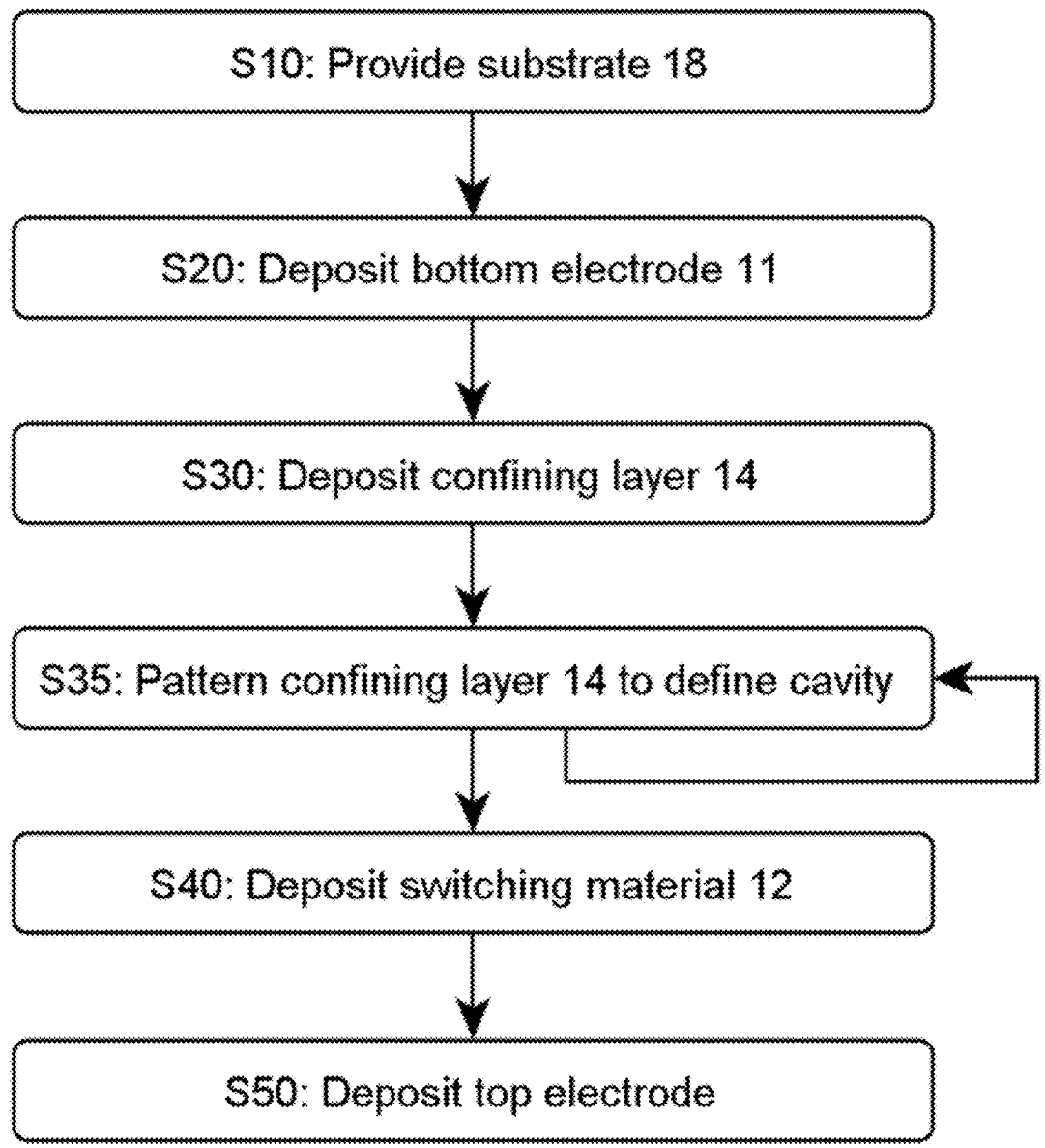
FIG. 10 is a flowchart illustrating high-level steps of an exemplary method of fabricating a resistively switchable element, according to an embodiment of the invention.

The memory element 10 further comprises a confining material 14, which defines a cell for the resistively switchable material 12. That is, the resistively switchable material 12 is laterally confined within the confining material 14, in a layer sandwiched between the two layers forming the two electrodes 11 and 13. The confining layer 14 may, for instance, be patterned onto one of the electrodes 11 such as to define the cell (i.e., an open cavity), which cavity is later on filled with the resistively switchable material 12, and finally closed by the deposition of the top electrode 13. This will be discussed in further detail in conjunction with FIG. 10.

Figure 2:
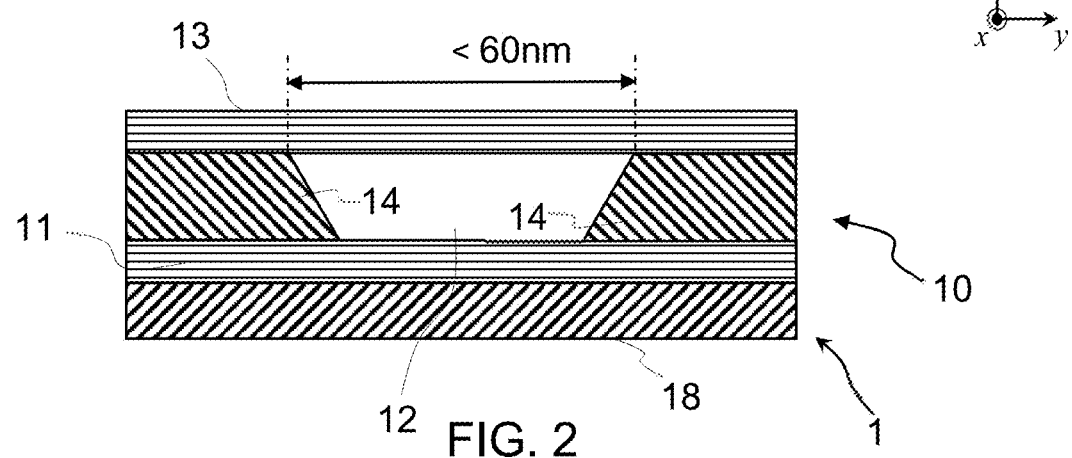
FIGS. 2-7 show respective 2D cross-sectional views of a corresponding exemplary resistive memory element, according to embodiments of the invention.
Figure 3:
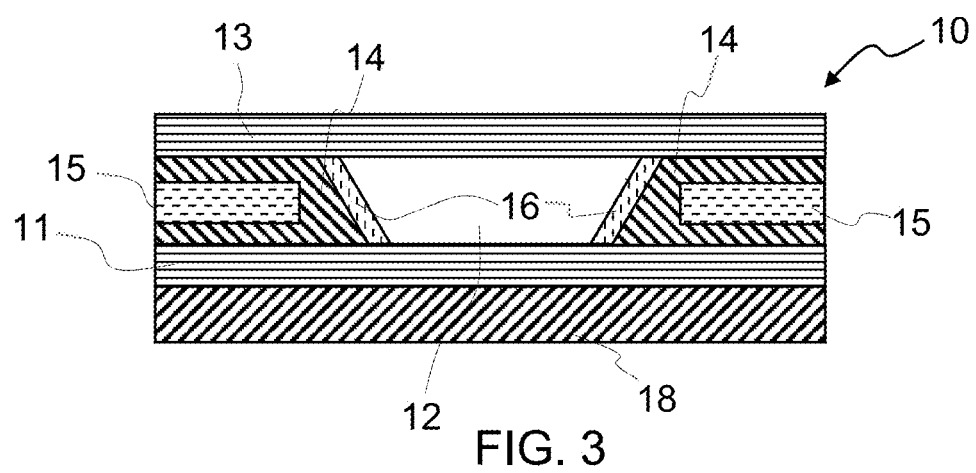

The term "laterally confined" as used herein is intended to broadly mean that the resistively switchable material 12 is laterally enclosed by the confining material 14, parallel to an average plane of the layer stack (it being noted that the layers 11, 12, 13, 14 are not necessarily planar). That is, if a stacking direction of the layer structure coincides with the z-axis, the confinement occurs perpendicular to the z-axis, in the (x, y) plane, as illustrated in FIGS. 1-3. The confinement is typically radial, assuming a locally cylindrical symmetry, as in FIGS. 1-7. Thus, assuming a cylindroid shape for the material 12, the base (top and bottom) surfaces of the cylindroid face a respective electrode 11, 13, whereas the lateral area of the cylindroid are contacted and enclosed by the confining material 14. As a result, the material 12 is vertically confined between the electrodes 11, 13 and laterally confined within the confining material 14.

Figure 6:
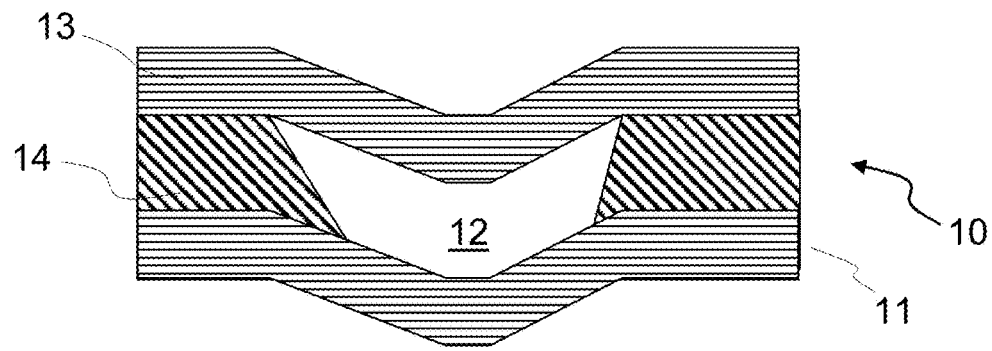
Figure 7:
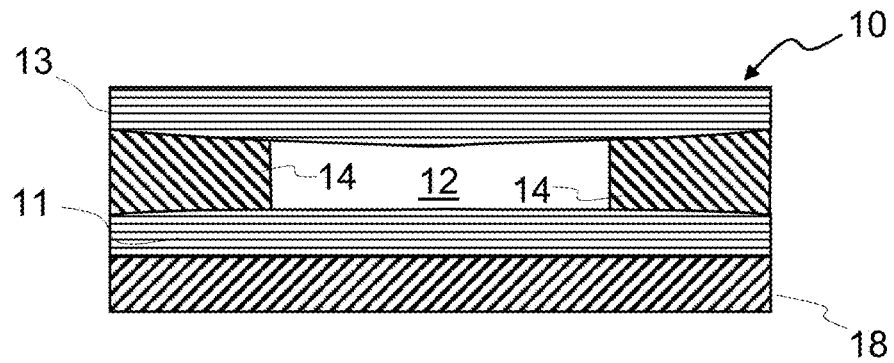

The layers 11, 12, 13 may have a non-planar shape; i.e., a non-perfect lamellar structure, as in FIG. 6 or 7. Still, the layer structure may approximately have a cylindrical symmetry in a region enclosing a vertical axis passing through the center of the cell 12. In such a case, the lateral confinement occurs within the sandwiched layer 12; i.e., the average direction of the confinement is radial, although not in a straight lamellae.

Figure 8:
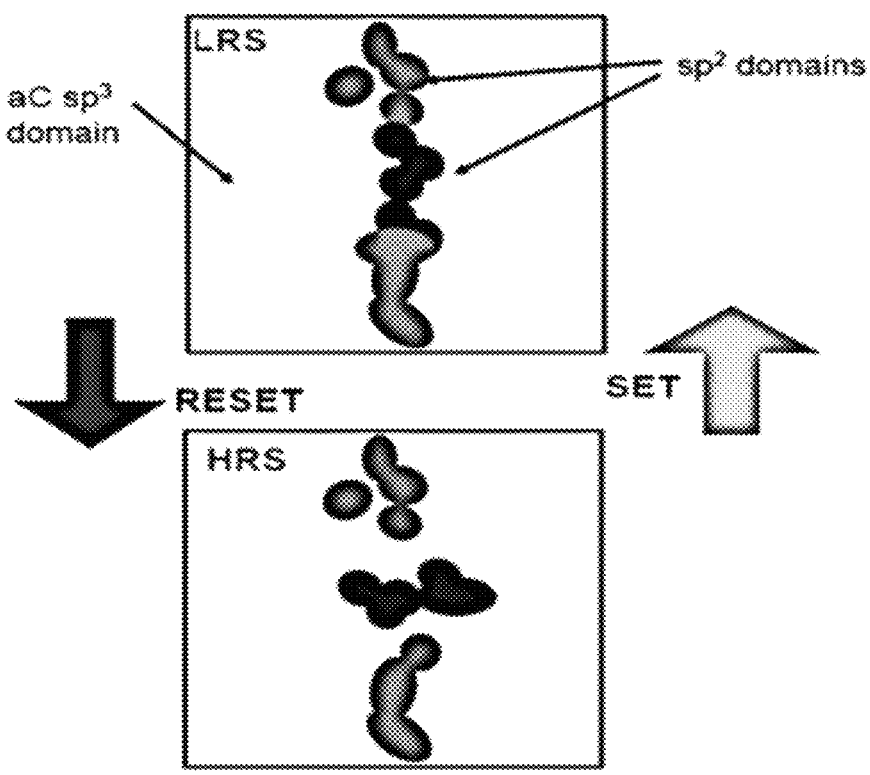
FIG. 8 illustrates a filamentary switching mechanism, as occurring in the resistively switchable material of a resistively switchable element, according to an embodiment of the invention.

The confining material 14 is sufficiently electrically insulating for an electric signal applied between the two conductive electrodes to change a resistance state of the memory element, in operation, and as known per se from resistively switching materials (the type of switching contemplated herein is a filamentary switching, to be discussed later in reference to FIG. 8). Still, the confining material 14 is chosen and designed so as to have a thermal conductivity greater than 0.5 W/(m·K), it being reminded that the thermal conductivity varies with both the thickness (or depth) of the material and the temperature. This is discussed in further detail herein below.

The resistively switchable material 12 is, in one or more embodiments, an amorphous compound comprising carbon. This compound essentially comprises amorphous carbon (hereafter aC, for short). By "amorphous," it is meant that the aC compound is essentially non-crystalline and lacks long-range order. Short-range order may exist, but with substantial deviations of the interatomic distances and/or interbonding angles with respect to crystalline forms of carbon, e.g., graphite lattice or diamond lattice (e.g., with at least 5% deviation). Now, "amorphous" should nevertheless be understood broadly, inasmuch as the aC compound may comprise small non-amorphous regions, e.g., microcrystalline or nanocrystalline regions. Notwithstanding, aC compounds as contemplated herein are assumed to remain essentially (and possibly entirely) amorphous.

The aC compound may, in one or more embodiments, comprise impurities and/or dopants. For example, the resistively switchable material 12 may be doped, e.g., with one or more of Si, H and N, which proves useful to improve chemical stability and reduce variability between different memory elements, as well as to further improve retention and endurance of the memory elements.

Since the confining material 14 in accordance with one or more embodiments is a thermal conductor (in contrast with conventional approaches), the resistively switchable material 12 is preferably designed so as to have restricted lateral dimensions, to thereby mitigate effects of the thermal conductor 14 on the power consumption, in operation. Namely, it has a maximal lateral dimension that is less than about 60 nanometers (nm), and more preferably less than about 30 nm, in one or more embodiments. The maximal lateral dimension is measured along a direction parallel to an average plane of (the main plane of) the two layers forming the two electrodes; i.e., parallel to the (x, y) plane in the accompanying drawings. Much better results, at least in terms of power consumption, will be obtained when the maximal lateral dimension of the aC compound is less than about 30 nm. The maximal lateral dimension here denotes a maximal lateral dimension of the aC compound as a whole, irrespective of the shape of the latter, and not a maximal lateral dimension of any specific part of the aC compound.

In addition, a lateral dimension less than 60 nm allows control of the maximum extent of the $sp^2$ rich region forming the conductive pathways, which turns out to be limited to about 1/10 of the diameter of the cell. In such a volume, the formation of multiple filaments is substantially lowered, if not suppressed.

Preferably, with lateral dimensions less than 30 nm, one ensures better reversibility because the filament formed has a smaller diameter, typically on the order of 1 to 3 nm, which eases the reset step.

The smaller the volume of the cell, the lower the power consumption. The thickness of the cell may accordingly be made small, e.g., smaller than 25 nm to be sufficiently conductive and allow the resistive material to switch at typical voltages used during operation (about 1 volt and typically less than 4 volts). The minimum thickness could, in fact, be reduced to 5 nm or even less, as long as the configuration (including the structure and thickness of the material 12) is still able to prevent a short between the electrodes.

Heat confinement was used in the past to allow for lower power consumption. In one or more embodiments of the invention, power consumption is lowered by reducing the volume of the switching element 12, and notably by reducing its lateral size, in comparison to prior art solutions. Reducing the volume of the switching element 12 further helps to control the formation of a single conductive filament in the resistively switchable material 12. Indeed, molecular-dynamics simulations have shown that the formation of large filaments is favored in larger cells, because the surrounding material can accommodate the expansion of the region in which the filament is formed.

In addition to reducing the size of the element 12, the latter may further be etched at a level of an interface between one of each of the two electrodes 11, 13, so as to be hollowed inward, as illustrated in FIG. 7. That is, the element 12, in one or more embodiments, has a concave shape, at least locally at the level of an interface with the electrode(s).

As stated above, the thermal conductivity varies with both the thickness (or depth) of the material and the temperature. Importantly, the thermal conductivity $k_f$ of a non-metallic thin film material can typically be two orders of magnitude below its bulk value $k_b$, for thicknesses less than 100 nm. For example, the thermal conductivity of AlN is of $k_b \approx 285$ W/(m·K) in the bulk, while it drops to $k_f < 1.8$ W/(m·K) for thicknesses less than 100 nm. On the other hand, the thermal conductivity of thin film is known to vary approximately as $k_f = k_b (1+R/t_f)$, where $t_f$ is the film thickness and R is the interfacial thermal resistance, which depends on the material interfaced to the thin film. In one or more embodiments, preferred values of R are less than about $2 \times 10^{-8}$ m²K/W.

Figure 9:
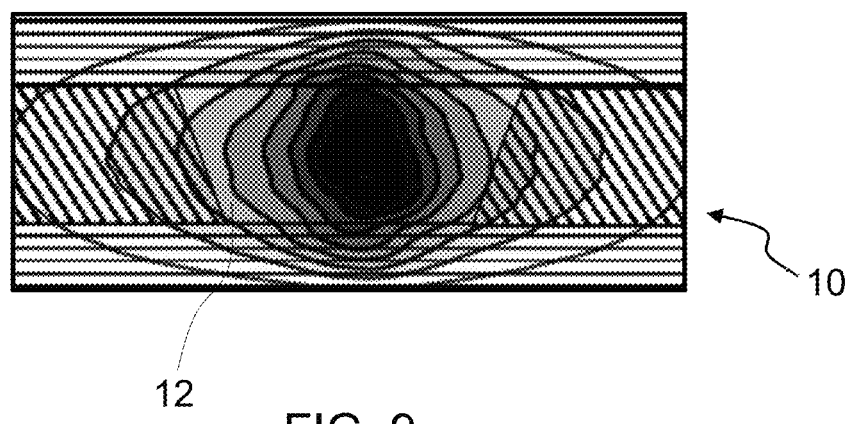
FIG. 9 is a 2D contour (and density) plot illustrating lateral heat dissipation in a resistively switchable element according to embodiments of the invention.

Numerical simulations have shown (based on a combined use of ab initio and classical molecular dynamics) that better heat dissipating structures may advantageously be employed in aC-based resistive memory elements, so as for the heat produced by the passage of an electric current through the conductive pathways to be removed laterally (in addition to being removed vertically) and thus more efficiently. They accordingly devised a solution wherein the memory element 10 enhances lateral heat dissipation using materials having higher thermal conductivities, as illustrated in the contour/density plot of FIG. 9.

The solution proposed herein is therefore to provide a confining material 14 having a thermal conductivity greater than 0.5 W/(m·K), e.g., for thicknesses that can be as low as 20 nm, it being reminded that the thermal conductivity of non-metallic thin film materials are typically two-orders of magnitude lower than the bulk's. The values of thermal conductivity are usually measured via the so-called 3 omega method and related electrothermal methods.

Still, the thermally conductive material 14 is nevertheless sufficiently electrically insulating to allow a filamentary switching in operation. The laterally confining material 14 is said to be electrically insulating as opposed to the electrically conducting electrodes. This means that the outer electrodes 11, 13 will essentially conduct an electric signal applied between the two conductive electrodes to change a resistance state of the memory element, in operation, whereas the confining material 14 will essentially confine the electrical signal, laterally. However, a semiconductor material may potentially be used for the confining material 14, provided it has an electrical conductivity lower than that of the resistively switching material (e.g., less than about $10^{-3}/(\Omega \cdot m)$ and preferably less than $10^{-7}/(\Omega \cdot m)$), its bandgap being typically more than 4.0 eV at room temperature. Aluminum nitride (AlN) may accordingly be used for the confining material. Silicon nitride (SiN), which clearly is an electrical insulator, may also be used for the confining material 14.

Conventional aC-based resistive memory elements commonly use silicon dioxide ($SiO_2$) as a lateral confinement layer, which is both electrically and thermally insulating. Silicon dioxide has a thermal conductivity of approximately 1.3-1.5 W/(m·K) in the bulk. However, the thermal conductivity of Sift drops below 0.5 W/(m·K) for thicknesses less than 30 nm. In that respect, the thermal conductivity of the confining material 14 is preferably greater than that of Sift, all things being otherwise equal and for comparable dimensions and shapes. For example, the confining material 14 may comprise SiN, whose thermal conductivity is about 0.5 W/(m·K) for a 20-nm thick film.

More generally, the confining material 14 is preferably a crystal (poly- or mon-crystal), as crystals usually provide better thermal conductivity than amorphous materials. The confining material 14 may for instance comprises one or more of the following materials or elements: silicon carbide (SiC), titanium carbide (TiC), boron nitride (BN), AlN, SiN, beryllium oxide (BeO), boron phosphide (BP), beryllium sulfide (BeS), gallium nitride (GaN), silicon (Si), aluminum phosphide (AlP), gallium phosphide (GaP), diamond and graphene, typically deposited as mono- or polycrystals. Using such materials and depending on the dimensions and shapes of the confining materials, thermal conductivity values achieved may be greater than or equal to, for example, 1, 10 or 30 or 40 W/(m·K). Yet, lower values would be obtained if a very thin membrane were used. The values of thermal conductivities indicated herein are values at room temperature.

Using carbon in diamond phase or graphene, with graphene layers aligned in the (x, y) plane is advantageous as it allows direct coupling to aC. Still, semiconductors such as poly-Si or amorphous Si would provide acceptable alternatives.

The electrodes 11, 13 will also dissipate heat during operation. They typically have a thermal conductivity that is greater than 50 W/(m·K), or preferably greater than 70 W/(m·K), e.g., 71.6 W/(m·K) when using Pt as a material for the electrodes or, better, 110 W/(m·K) if TiN is used, or 173 W/(m·K) for W, etc. Still, considering that for the electrically conducting electrodes the heat is removed also by electrons, the thermal conductivity of the electrodes is less dependent on the thickness. In variants, the bottom and/or top electrodes 11, 13 can be made of conductive carbon, which can adequately be coupled to the resistive material 12 at fabrication.

Since both the electrodes and the laterally confining material 14 are thermal conductors, both a lateral and a vertical temperature gradient will be created in the aC cell during operation. The vertical temperature gradient caused by the electrodes confines the extent of the reset, i.e., the breaking of $sp^2$ clusters by lowering kinetic energy of the carbon atoms towards the top and bottom electrodes 11, 13.

The taper design of the material 14, as seen in FIGS. 1-6, is a consequence of a typical fabrication method used for fabricating aC-based resistive memory elements. In variants, one may seek to obtain non-tapered portions 14, as illustrated in FIG. 7, to reduce the volume of the cell 12 and favor filamentary switching.

Figure 5:
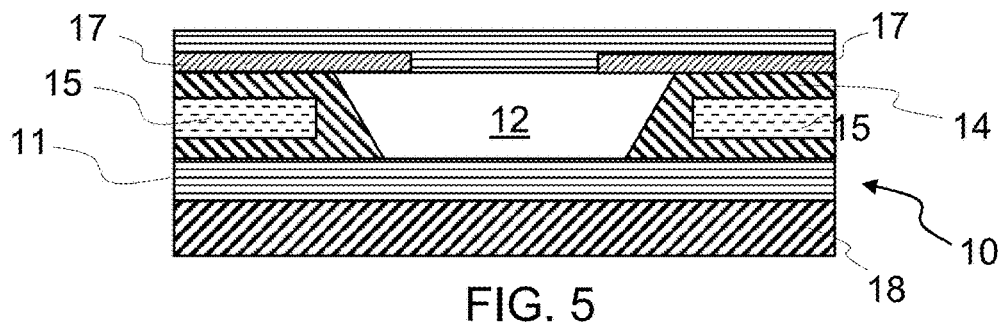

In addition, smaller apparent top and/or bottom electrodes may be provided, by patterning the electrodes. For instance, and as illustrated in FIG. 5, a memory element 10 may, in some embodiments, be configured so that one of the electrodes 13 has a maximal lateral dimension that is substantially less than the maximal lateral dimension of the resistively switchable material 12 at the level of an interface between said one of the electrode and the resistively switchable material. This can notably be achieved by way of additional electrically insulating structures 17, deposited prior to the electrode 13 (see FIG. 5). Both electrodes may similarly be designed to offer a reduced interface to the material 12. Such a design of the electrodes favors the formation of a single filament in the central part of the aC material 12.

In one or more embodiments, the resistive memory element 10 may further comprise one or more additional electrically conducting structures 15, as illustrated in FIGS. 1, 3, 4 and 5. The additional structures 15 are arranged so as to further dissipate heat laterally, in a region extending between the electrodes 11, 13. Here, the confining material 14 is in contact with the additional conducting parts 15 and is further shaped so as to electrically insulate each of the electrodes 11, 13 and the switchable material 12 from the additional structures 15. In other words, the structures 15 are (at least partly) embedded in and electrically insulated by the confining material 14.

As an electrical conductor, a structure 15 will likely be more thermally conductive than the material 14, all things being otherwise equal. In this respect, the additional structures 15 preferably have, each, a thermal conductivity that is greater than or equal to 30 or 40 W/(m·K) or, more preferably, even greater than or equal to 100 W/(m·K). Thus, the additional structures 15 enhance the thermal conductivity properties of the confining structure 14, 15 and thereby help to further dissipate heat laterally during operation. Still, the material 14 is appropriately shaped around the structures 15 to prevent electrical shortcuts.

Referring now to FIG. 3, an intermediate stiffening material 16 may be provided such that the resistively switchable material 12 is laterally confined by the stiffening material 16, itself laterally confined within the material 14. To confer adequate stiffening properties, the stiffening material 16 should be harder than the material 14. The stiffening material 16 may, for instance, have a Knoop hardness (also referred to as a microhardness test method, which is a well-known test for mechanical hardness) that is greater than or equal to 2470 kg/mm/mm, should TiC be used for the material 16. Meanwhile, the material 16 should be selected so as to have a thermal conductivity consistent with that of the material 14, to not impair the lateral heat dissipation by the outer material 14; that is, its thermal conductivity should be at least equal to or greater than that of the confining material 14. For example, the thermal conductivity value of TiC may vary between 17 and 31 W/(m·K), depending on its state (e.g., ceramic or crystal), the thickness and temperature.

The stiffening material 16 creates 'hard' sidewalls which keep the cell volume constrained. That is, it prevents the cell 12 from bulging, in operation. The volume expansion results from an increase of $sp^2$ carbon atoms. An excessive expansion may produce irreversible re-hybridization of $sp^3$ carbon atoms into $sp^2$ carbon atoms. Thus, rigidifying the cavity (and thereby imposing a larger activation energy barrier for bond breaking) makes it possible to lower the re-hybridization phenomenon. As a result, a carefully selected stiffening layer 16 curbs the degradation of the cell and, in turn, helps to confine the formation of conductive pathways in the central region of the material 12.

Figure 4:
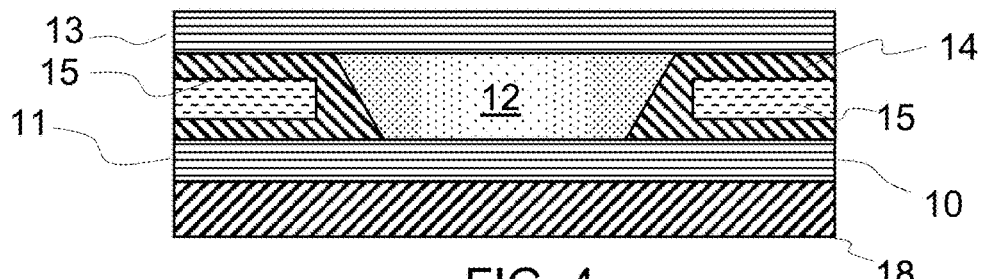

As illustrated in FIG. 4, the resistively switchable material 12 may, in one or more embodiments, exhibit a lateral density gradient. Namely, a density of the resistively switchable material at the periphery, i.e., close to the confining material 14, may be measurably larger than the density at the center of the material 12. A low density in the central region was found to facilitate the set and reset (FIG. 8) operation at the center of the cell, while the high density at the lateral sides prevents graphitization of the aC compound 12.

To that aim, one may vary the concentrations of $sp^2$ and $sp^3$ carbon atoms, as the density and $sp^3$ contents are related. In one or more embodiments, the aC compound comprises more than 35 at. % (atomic percent) $sp^3$ carbon atoms when the resistively switchable material 12 in its pristine state, which was found to substantially decrease the risk of irreversible switching.

Yet, one may ideally have between 40 and 50 at. % of $sp^3$ carbon atoms in the central part of the material 12, which corresponds to an experimental density or more than 2.4 g/cm$^3$. The atomic percentages given here reflects preferred percentages of carbon atoms involved in a $sp^3$ hybridized bond (i.e., a carbon atom bonded to four other carbon atoms via single bonds), relative to the total number of carbon atoms in the switching material 12. The atomic percentage can be measured by comparing relative intensities of spectroscopic peaks (e.g., EELS, XPS, or Raman spectroscopy) to reference values. Note that the preferred atomic percentages of $sp^3$ carbon atoms given here are calculated with respect to the total number of carbon atoms in the material 12, irrespective of eventual dopants or impurities, i.e., similarly as a percentage obtained from the atomic ratio of $sp^3$ carbon atoms to all (and only) the carbon atoms.

The shape of the low-density region is typically cylindroid, with the axis of the cylinder parallel to the z-direction. Moving from the central axis of the material 12 in the (x, y) plane, the density increases (the larger the better), preferably by at least by 0.2 g/cm$^3$. The density gradient improves the chance, in practice, that only a single conductive pathway forms in the cylinder, while lowering the probability of forming peripheral conductive pathways. For example, if the center of the material has a density of 2.5 g/cm$^3$, a peripheral density of at least 2.7 g/cm$^3$ should preferably reached. A density increment greater than 0.2 g/cm$^3$, e.g., greater than or equal to 0.5 g/cm$^3$ is even more preferred.

Note that the density does not need to uniformly vary; i.e., there is no need for a constant gradient. One may, for example, have an approximately constant, low-density region with a cylindroid shape (with a radius of about 10 nm) enclosed by an approximately constant, higher density region, with an abrupt density transition.

Since the resistive switching involves atoms in the low-density region, after the first cycles, by operating the device, the density gradients may adjust to achieve a somehow uniform radial gradient. Simulations show that the gradients can be created from a pristine memory cell of uniform density, provided that the first conduction pathway is formed essentially in the middle of the material 12. The first conduction pathway will more easily form in the cylindroid if the latter provides a lower resistive pathway. This can be achieved, for example, by etching the top, the bottom or both the bottom and top sides of the carbon cell 12, as depicted in FIG. 7, and as stated earlier.

This way, a concave shape is achieved, which is advantageous in many respects. First, it helps reduce the cell 12 size, which helps reduce power consumption, as previously stated. In addition, this is advantageous as one ideally wants to make the cell as small as possible, to gain space and increase the overall density of electronic components (e.g., memory devices).

A density gradient could also be achieved by a specific process to deposit the carbon atoms and, possibly, by a post-deposition treatment, e.g., a bombardment by atoms.

Next, according to another aspect, the invention can also be embodied as a resistive memory device 1, as illustrated in FIG. 1. The memory device 1 may comprise one or more memory elements 10 such as described above. The resistive memory device 1 is preferably configured as a resistive random access memory element.

The resistive memory device 1 has a region 12 between electrodes 11, 13 with an aC switchable resistance. The resistance in this region 12 is reversibly switchable between different states, e.g., by applying different voltage pulses 24, using a pulse generator, in one or more embodiments. The application of voltage pulses 24 leads to different resistance states of the region 12. By measuring the current 25, which flows through the region 12, the different resistance states can be read.

The resistive layer can furthermore be programmed in order to provide different resistance states upon application of an electric signal between the two conductive electrodes, the resistance state of the aC compound 12 embodying information stored in the memory element.

Storing information in a resistive memory element as described above is achieved by applying an electric signal, such as a voltage pulse 24, between the two conductive electrodes 11, 13 of said memory element 10, to change the resistance state of the memory element.

Namely, in order to set the cell, which is initially in high resistance state (HRS, FIG. 8), a voltage pulse may be applied, which will induce the formation of a conductive $sp^2$ filament (preferably a single filament) within the aC layer, bringing the cell into a low resistance state (LRS). Next, another voltage (reset) can be applied across the cell, causing a high current to flow through the $sp^2$ filaments. These filaments break down and the cell returns to a high resistance state. The aC cells can be switched either by applying voltage pulses of the same polarity (unipolar switching) or by applying voltage pulses of opposite polarities (bipolar switching). The corresponding $R_{OFF}/R_{ON}$ ratio is typically 100 or higher. The endurance of the cell is typically higher than 100 cycles and the retention of the resistance states typically longer than $10^4$ seconds.

Next, and according to a final aspect, the invention can be embodied as a fabrication method of a resistive memory element 10 as described above. Basically, in one or more embodiments, a simple fabrication method comprises the following steps:

First, a substrate is provided S10. The substrate may for instance comprise silicon;

Second, the bottom electrode 11 is formed S20 on top of the substrate. The bottom electrode is typically created inside a suitable, electrically isolating layer. The bottom electrode may be created by trench filling and chemical mechanical polishing or by patterning of the electrode material. The electrode material can, e.g., be a metal nitride;

Then, one may deposit S30 the confining material 14 on top of the bottom electrode 11 and structure it (while depositing or preferably after S35) so as to define a cavity, which has a maximal lateral dimension that is less than 60 nm, for reasons discussed earlier;

Next, the resistively switchable material 12 is deposited S40, as an amorphous aC compound, to fill the cavity defined at step S30; and Then, the top electrode 13 is deposited S50 on top of the resistively switchable material 12. Again, the top electrode may comprise a metal nitride.

At step S30, a layer stack may be obtained which contains thermally conductive materials 15, in addition to the electrically insulating material 14, using known patterning techniques. The cavity may then be etched S35 to define the memory cell. Many devices may be fabricated in parallel, i.e., several cavities would be opened at step S35, as suggested by the backloop in FIG. 10. At step S40, the memory material is deposited inside the cavities and chemical mechanical polishing (CMP), or an alternative planarization process, is used to remove excess material outside of the cavities. A preferred deposition technique for material 12 is the chemical vapor deposition (CVD). Variants to the above fabrication method have already been stated earlier, notably in reference to FIG. 7.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. A resistive memory element having a layer structure, the layer structure comprising:
   two layers forming two electrically conductive electrodes, respectively;
   a resistively switchable material, sandwiched between the two layers forming the two electrodes, and in electrical connection therewith; and
   a confining material, the resistively switchable material laterally confined within the confining material,
   wherein:
   the confining material is sufficiently electrically insulating for an electric signal applied between the two conductive electrodes to change a resistance state of the memory element, in operation; and has a thermal conductivity greater than 0.5 W/(m·K), and the resistively switchable material is an amorphous compound comprising carbon, which has a maximal lateral dimension, along a direction parallel to an average plane of the two layers forming the two electrodes, that is less than 60 nm.

2. The resistive memory element according to claim 1, wherein the confining material has a thermal conductivity greater than or equal to 30 W/(m·K).

3. The resistive memory element according to claim 2, wherein the confining material comprises at least one of SiC, TiC, BN, AlN, SiN, BeO, BP, BeS, GaN, Si, AlP, GaP, diamond and graphene.

4. The resistive memory element according to claim 2, wherein the maximal lateral dimension of the resistively switchable material is less than 30 nm.

5. The resistive memory element according to claim 4, wherein the memory element is configured such that one of the electrodes has a maximal lateral dimension that is substantially less than the maximal lateral dimension of the resistively switchable material at a level of an interface between said one of the electrode and the resistively switchable material.

6. The resistive memory element according to claim 1, further comprising an additional electrically conducting material, arranged to further dissipate heat laterally, between the electrodes, the confining material being in contact with the additional electrically conducting material and shaped so as to electrically insulate each of the electrodes and the resistively switchable material from the additional electrically conducting material.

7. The resistive memory element according to claim 6, wherein the additional electrically conducting material has a thermal conductivity greater than or equal to 40 W/(m·K).

8. The resistive memory element according to claim 1, wherein the resistively switchable material is laterally confined by a stiffening material, which itself is laterally confined by said confining material, wherein the stiffening material has a Knoop hardness that is greater than the Knoop hardness of the confining material.

9. The resistive memory element according to claim 8, wherein the stiffening material comprises titanium carbide.

10. The resistive memory element according to claim 1, wherein the resistively switchable material exhibits a lateral density gradient, such that a density of the resistively switchable material close to the confining material is greater than a density at the center of the resistively switchable material.

11. The resistive memory element according to claim 1, wherein the resistive switching material is etched at a level of an interface between one of each of the two electrodes, so as to be hollowed inward.

12. The resistive memory element according to claim 1, wherein the resistively switchable material is in direct contact with each of: the electrodes; and one of the laterally confining layer and a stiffening material laterally confined by the confining layer.

13. The resistive memory element according to claim 1, wherein the amorphous carbon compound comprises more than 35 at. % $sp^3$ C atoms when the resistively switchable material is in its pristine state.

14. The resistive memory element according to claim 1, wherein the amorphous carbon compound comprises more than 50 at. % $sp^3$ C atoms when the resistively switchable material is in its pristine state.

15. The resistive memory element according to claim 1, wherein the resistively switchable material is doped with at least one of the following elements: O, Si, H and N.

16. The resistive memory element according to claim 1, wherein the layer structure comprises several layers superimposed along a stacking direction z, and the resistively switchable material is laterally confined in a plane, perpendicular to said direction z, within the confining material.

17. A resistive memory device comprising one or more memory elements, each of at least a subset of the one or more memory elements having a layer structure, the layer structure comprising:

two layers forming two electrically conductive electrodes, respectively;

a resistively switchable material, sandwiched between the two layers forming the two electrodes, and in electrical connection therewith; and a confining material, the resistively switchable material laterally confined within the confining material, wherein:

the confining material is sufficiently electrically insulating for an electric signal applied between the two conductive electrodes to change a resistance state of the memory element, in operation; and has a thermal conductivity greater than 0.5 W/(m·K), and the resistively switchable material is an amorphous compound comprising carbon, which has a maximal lateral dimension, along a direction parallel to an average plane of the two layers forming the two electrodes, that is less than 60 nm.

18. The resistive memory device according to claim 17, wherein the memory device is configured as a resistive random access memory element.

19. A method of storing information in a resistive memory element having a layer structure as defined in claim 1, the method comprising:

applying an electric signal between the two conductive electrodes of said memory element to change a resistance state of the memory element.

* * * * *